United States Patent [19]

Nelson et al.

[11] Patent Number: 5,490,910
[45] Date of Patent: Feb. 13, 1996

[54] CIRCULARLY SYMMETRIC SPUTTERING APPARATUS WITH HOLLOW-CATHODE PLASMA DEVICES

[75] Inventors: Carl W. Nelson, Hayward; Richard D. Weir, Agoura Hills, both of Calif.

[73] Assignee: Tulip Memory Systems, Inc., Fremont, Calif.

[21] Appl. No.: 400,137

[22] Filed: Mar. 6, 1995

Related U.S. Application Data

[63] Continuation of Ser. No. 101,403, Aug. 3, 1993, abandoned, which is a continuation-in-part of Ser. No. 848,251, Mar. 9, 1992, Pat. No. 5,232,569.

[51] Int. Cl.$^6$ .................................................. C23C 14/34
[52] U.S. Cl. ............................... 204/192.15; 204/192.22; 204/298.06; 204/298.08; 204/298.25; 204/298.26
[58] Field of Search ........................ 204/192.12, 192.15, 204/192.32, 192.22, 298.08, 298.06, 298.16, 298.17, 298.19, 298.23, 298.25, 298.26

[56] References Cited

U.S. PATENT DOCUMENTS

| 3,369,991 | 2/1968 | Davidse | 204/298 |
|---|---|---|---|
| 3,562,141 | 2/1971 | Morley | 204/298 |
| 3,661,761 | 5/1972 | Koenig | 204/298 |
| 4,042,128 | 8/1977 | Shrader | 214/17 B |

(List continued on next page.)

FOREIGN PATENT DOCUMENTS

| 61-127862 | 6/1986 | Japan | 204/298.16 |

OTHER PUBLICATIONS

Thorton, "Influence of Apparatus Geometry And Deposition Conditions On The Structure And Topography Of Thick Sputtered Coatings", J. Vac. Sci. Technol., vol. 11, No. 4, Jul./Aug. 1974; pp. 666–670.
Hoffman, et al., "Microstructural Control Of Plasma–Sputtered Refractory Coatings", Handbook of Plasma Processing Technology; pp.–483–517.
Burke, et al., "DECR In Silicon Processing", J. Vac. Sci. Technol. A. vol. 8, No. 3, May/Jun. 1990; pp. 2932–2938.
Koenig, et al., "Application Of RF Discharges To Sputtering" IBM J. Res. Develop., Mar. 1970; pp. 168–171.
Logan, "Control Of RF Sputtered Film Properties Through Substrate Tuning" IBM J. Res. Develop., Mar. 1970; pp. 172–175.
Vossen, "Glow Discharge Phenomena In Plasma Etching And Plasma Deposition", J. Electrochem. Soc.: Solid–State Science & Technology, vol. 126, No. 2, Feb. 1979; pp. 319–324.
Kaufman, et al. "Analysis Of Area–Ratio Effect For Radio–Frequency Diode", J. Vac. Sci. Technol. A 6(4), Jul./Aug. 1988; pp. 2572–2573.
Vossen, "Control Of Film Properties By rf–Sputtering Techniques", The Journal Of Vacuum Science & Technology, vol. 8, No. 5; pp. S12–S30.
Coburn, et al. "Positive–ion Bombardment Of Substrates In rf Diode Glow Discharge Sputtering" J. Appl. Phys., vol. 43, No. 12, Dec. 1972; pp. 4965–4971.
Morley, "Hollow Cathode Discharge Beams In Vacuum Processing", Trans. Vac. Met. Conf. 1963; American Vac. Soc.; pp. 186–202.
Morley, et al. "High Rate Ion Production For Vacuum Deposition"; reprinted from J. Vac. Sci. Technol., vol. 9, No. 6, Nov.–Dec. 1972.

Primary Examiner—Nam Nguyen
Attorney, Agent, or Firm—Limbach & Limbach

[57] ABSTRACT

A sputtering apparatus for depositing thin films on substrates is disclosed, which includes a process chamber having a central sputtering region and an annular plasma distribution region surrounding and open to the central sputtering region, a planar disk diode positioned in the central sputtering region of the process chamber, a mechanism for positioning a substrate within the central sputtering region adjacent to the planar disk diode, and a plasma generation means for supplying plasma to the annular plasma distribution region of the process chamber for diffusion into the central sputtering region.

21 Claims, 8 Drawing Sheets

U.S. PATENT DOCUMENTS

| | | | |
|---|---|---|---|
| 4,197,175 | 4/1980 | Moll et al. | 204/192 |
| 4,254,159 | 3/1981 | Pulker et al. | 427/38 |
| 4,346,123 | 8/1982 | Kaufmann | 427/38 |
| 4,534,842 | 8/1985 | Arnal | 204/192 E |
| 4,588,490 | 5/1986 | Cuomo et al. | 204/298 |
| 4,610,770 | 9/1986 | Saito et al. | 204/298.16 X |
| 4,619,748 | 10/1986 | Moll et al. | 204/192.31 |
| 4,663,009 | 5/1987 | Bloomquist et al. | 204/298.25 X |
| 4,721,553 | 1/1988 | Saito et al. | 204/298.16 X |
| 4,745,337 | 5/1988 | Pichot et al. | 315/111.41 |
| 4,749,465 | 6/1988 | Flint et al. | 204/298.25 |
| 4,824,546 | 4/1989 | Ohmi | 204/298.08 |
| 4,957,604 | 9/1990 | Steininger | 204/192.2 X |
| 4,990,229 | 2/1991 | Campbell et al. | 204/298.16 X |
| 5,091,049 | 2/1992 | Campbell et al. | 156/643 |
| 5,116,482 | 5/1992 | Setoyama et al. | 204/298.08 |
| 5,232,569 | 8/1993 | Nelson et al. | 204/298.16 X |

CIRCULARLY SYMMETRIC SPUTTERING APPARATUS WITH HOLLOW-CATHODE PLASMA DEVICES

This is a continuation of application Ser. No. 08/010,403 filed on Aug. 3, 1993 abandoned which is a continuation in part of Ser. No. 07/848,251 filed Mar. 9, 1992 now U.S. Pat. No. 5,232,569.

BACKGROUND OF THE INVENTION

1. Field of the Invention

The present invention relates generally to apparatus for fabricating magnetic-recording and magneto-optical disks, and relates more specifically to a circularly symmetric, large-area, high-deposition-rate sputtering apparatus having a supported gas discharge provided by hollow-cathode plasma devices.

2. Description of the Relevant Art

In the fabrication of data-storage media (both magnetic-recording and magneto-optical) the most common technique for depositing the various thin-film layers is magnetron diode sputtering. The sputtering system approaches that are used in the production of magnetic-recording media consist mainly of two configurations: 1) for each thin-film layer, dual-side coating of a single disk substrate in the static-deposition mode from a pair of circularly symmetric planar (or planar ring) magnetron diode sputtering sources, and 2) for each thin-film layer, dual-side coating of a platen of several disk substrates in the dynamic deposition (passby) mode from a pair of rectangular planar magnetron diode sputtering sources.

Both approaches are best accomplished in systems where process-isolated chambers are provided so that preliminary steps of substrate outgassing, sputter-etch cleaning, and heating, during which reactive gases (water vapor, air, organic solvents) are evolved, do not interfere with later sputter-deposition steps, which take place in an inert gas atmosphere. Similarly, reactive sputter deposition, involving a target material where a reactive gas (or gases) is intentionally employed or involving a target material whose composition comprises a reactive-gas constituent or whose microstructure contains a reactive gas (or gases) in its micropores, must be carried out in an isolated process chamber. This extremely important aspect pertaining to vacuum cleanliness is much more easily implemented in a system design based upon static deposition than on one based upon passby deposition. The presence of unwanted reactive gases during sputtering has a deleterious effect on the morphology and the magnetic properties of the deposited films, greatly affecting their uniformity and reproducibility.

In the aforementioned static- and dynamic-deposition sputtering system approaches, due to the requirement of product throughput, the sequential steps are essentially simultaneous at several stations such that there is a disk substrate at or a platen of disk substrates passing by each of the several stations. The static-deposition approach, in which a single disk substrate per pair of circular symmetric sputtering sources is employed, has a significant advantage in that excellent circumferential uniformity of film morphology and thus of magnetic characteristics is obtained, even at the lowest (which is highly desirable) sputtering gas pressure. However, there are disadvantages to this particular static-deposition approach in that the product throughput and coating cost are independent of disk diameter and the economies of scale are not available for costly components, such as source power supplies and chamber vacuum valves, pumps, gauges, mass flow controllers, the transport mechanism, the process sequencer, etc.—the major cost-determining items of the sputtering system.

This situation is reversed in the passby approach where a platen of several disk substrates per pair of rectangular line-deposition sputtering sources is employed. However, a serious disadvantage entailed in the passby approach is the lack of circumferential uniformity of film morphology and hence of magnetic characteristics along the circular tracks of the disk. These undesirable features are caused by the source-determined differing and changing angles of incidence of the arriving sputtered atoms at the substrate as the platen passes by the line-deposition sources. This problem can be overcome by operation at higher sputtering gas pressure or with increased source-to-substrate separation or with some combination of both. Since the sputtered atoms undergo accordingly many more gas collisions in transit, their directionality is lost and their arrival angles become randomized, and thus the advantages of low-pressure deposition are thereby sacrificed. The once energetic sputtered atoms, losing their energy by gas collisional scattering, become thermalized. Consequently, the adhesion of the film to the substrate decreases, with an abrupt interfacial boundary forming instead of a graded diffused one. Additionally, the cohesive strength of the film decreases, with a resulting structure of thermalized-atom-deposited porous columnar Zone 1 or the still more porous Zone 1' (on the Movchan-Demchishin-Thornton zone-structure diagram) instead of the energetic-atom-deposited dense fibrous Zone T structure. References on the subject of coating zone structures include the following: J. A. Thornton, J. Vac. Sci. Technol. 11, 666 (1974); D. W. Hoffman and R. C. McCune in "Handbook of Plasma Processing Technology", S. M. Rossnagel, J. J. Cuomo, and W. D. Westwood, eds., Ch. 21, pp. 483–517, Noyes Publications, Park Ridge, N.J. (1990).

Another sputtering system approach, though not in general use for the production of data-storage media, entails the use of high-radiofrequency-powered (13.56 MHz) large-area circularly symmetric planar disk diode sputtering sources. In this approach, for each thin-film layer, dual-side coating of a platen of several disk substrates in the static-deposition mode from a pair of these large-area sputtering sources would be employed, thereby combining the advantages of the two aforementioned approaches with none of their respective disadvantages. There is, however, one inherent disadvantage of the 13.56 MHz rf planar disk diode sputtering source; namely, for a given system configuration, lower deposition rates are obtained as compared to magnetron diode sputtering sources. However, the sputtering-target utilization of rf planar disk diode sources is greater than 90%, which is very much better utilization than that of planar magnetron diode sources, particularly for target materials of ferromagnetic and ferrimagnetic substances.

In addition, a properly designed sputtering system configuration with two like oppositely facing rf planar disk diode sources requires that the chamber diameter or box size be at least three times the diameter of the source so that there be sufficient grounded area in contact with the gas discharge in order to keep the plasma potential low with respect to ground. Since such systems are geometry dependent with the rf power and hence voltage dividing according to the respective areas of the target electrode (or electrodes) and of the grounded walls in contact with the gas discharge (the Koenig-Maissel relationship), the plasma potential with respect to ground then (1) increases with increasing geometrical confinement for a given power input, (2) increases with increasing power input for a given pressure, and (3) decreases with increasing pressure for a given power input. Thus, inadvertently, surfaces other than the sputtering target become subject to energetic ion bombardment (i.e., sputtering) in systems with geometrically confined rf discharges, resulting in the contamination of the sputter-deposited films with the materials of the chamber construction. The significant references further describing this phenomenon are as follows: H. R. Koenig and L. I. Maissel, IBM J. Res. Develop. 14, 168 (1970); U.S. Pat. No. 3,661,761, invented by H. R. Koenig, issued May 9, 1972, assigned to IBM Corp.; J. W. Coburn and E. Kay, J. Appl. Phys. 43, 4965 (1972); J. L. Vossen, J. Electrochem. Soc. 126, 319 (1979); and H. R. Kaufman and S. M. Rossnagel, J. Vac. Sci. Technol. A6, 2572 (1988).

A method and device for obtaining a higher-plasma-density gas discharge by coupling a dc-powered hollow-cathode plasma device to a dc-powered planar disk (or rectangular) magnetron diode sputtering source, making in effect a triode configuration, are disclosed in J. J. Cuomo, H. R. Kaufman, and S. M. Rossnagel, U.S. Pat. No. 4,588,490, issued May 13, 1986 (filed May 22, 1985), assigned to IBM Corp. This hollow-cathode plasma device depends on thermionic electron emission for its operation.

SUMMARY OF THE INVENTION

In accordance with the illustrated preferred embodiment, the present invention is a sputtering apparatus and related invention for depositing thin films on substrates, where the apparatus includes a process chamber having a central sputtering region and an annular plasma distribution region surrounding and open to the central sputtering region, a planar disk diode positioned in the central sputtering region of the process chamber, a means for positioning a substrate within the central sputtering region adjacent to the planar disk diode, and a means for generating and supplying plasma to the annular plasma distribution region of the process chamber for diffusion into the central sputtering region.

The sputtering apparatus of the present invention deposits a thin film on a substrate by utilizing two or more symmetrically disposed high-radiofrequency-powered (13.56 MHz) coldwall hollow-cathode plasma devices to excite a plasma and to create a uniform region of plasma for sputtering by at least one high-radiofrequency-powered planar disk diode positioned within the uniform plasma region. Either inert or reactive gases can be ionized. The apparatus of the present invention can be used for sputtering, reactive sputtering, substrate bias sputtering, reactive substrate bias sputtering, and reactive plasma deposition. Reactive plasma deposition is also known as plasma-enhanced or plasma-assisted chemical vapor deposition.

The present invention provides an improved and very versatile sputtering system configuration for the manufacture of magnetic-recording and magneto-optical data-storage disks. One advantage of the present invention is that it reduces the costs involved in the manufacture of magnetic-recording and magneto-optical disks by achieving a high deposition rate and high utilization of the sputtering-target material. Another advantage of the present invention is that it provides radiofrequency substrate biasing, with higher bombarding-ion current density than is normal, for enhanced control of the film morphology and hence control of the magnetic properties. The moderate-deposition-rate and the large-grounded-area limitations of prior rf planar disk diode sputtering configurations are overcome by means of a supported gas discharge supplied by the coldwall hollow-cathode plasma devices.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENTS

FIGS. 1 through 10 of the drawings and the following description depict various preferred embodiments of the present invention for purposes of illustration only. One skilled in the art will readily recognize from the following discussion that alternative embodiments of the structures and methods illustrated herein may be employed without departing from the principles of the invention described herein. While the invention will be described in conjunction with the preferred embodiments, it will be understood that they are not intended to limit the invention to those embodiments. On the contrary, the invention is intended to cover alternatives, modifications, and equivalents, which may be included within the spirit and scope of the invention as defined by the claims.

Figure 1:
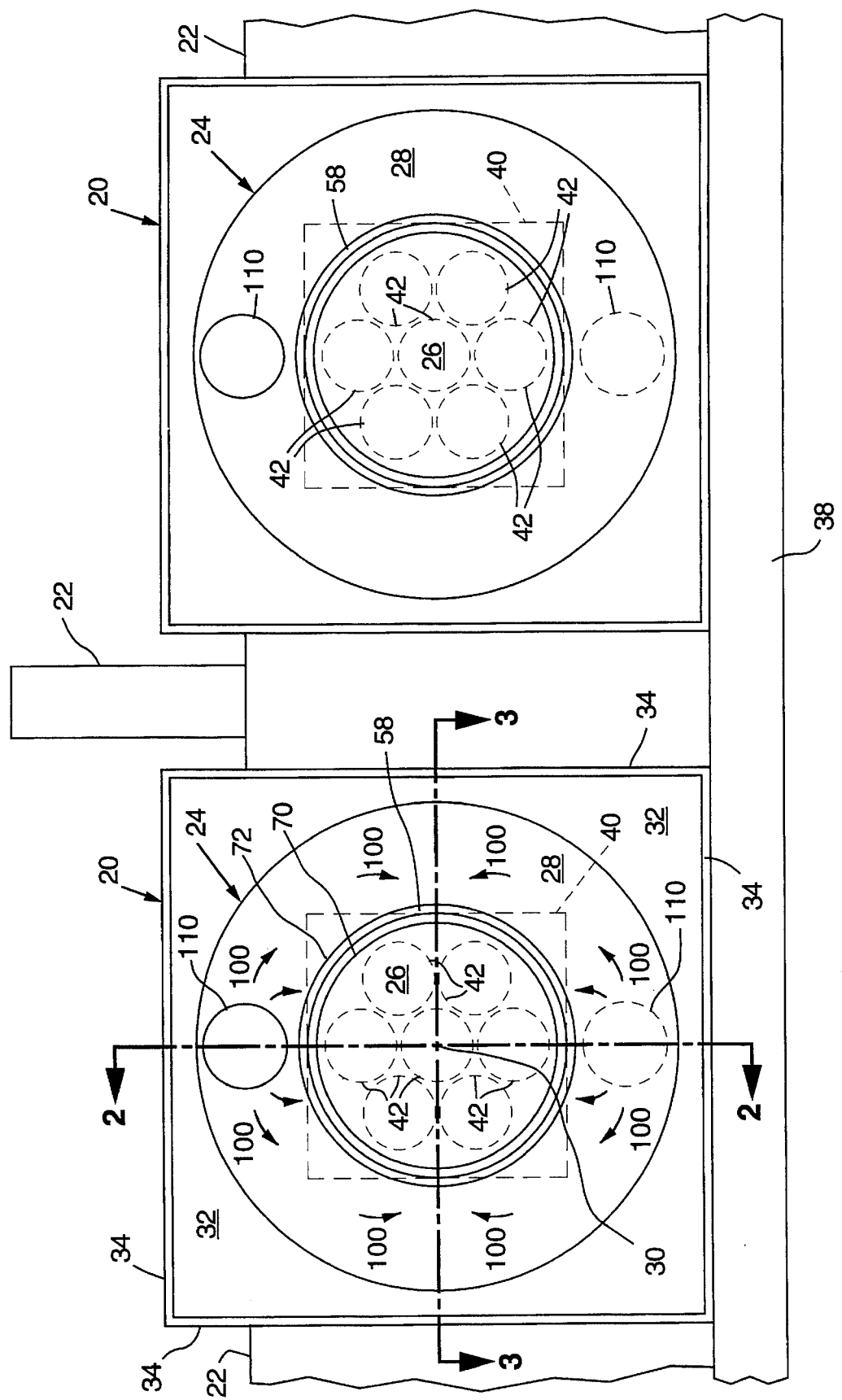
FIG. 1 is a side elevation view of two circularly symmetric sputtering sources according to the present invention.
Figure 2:
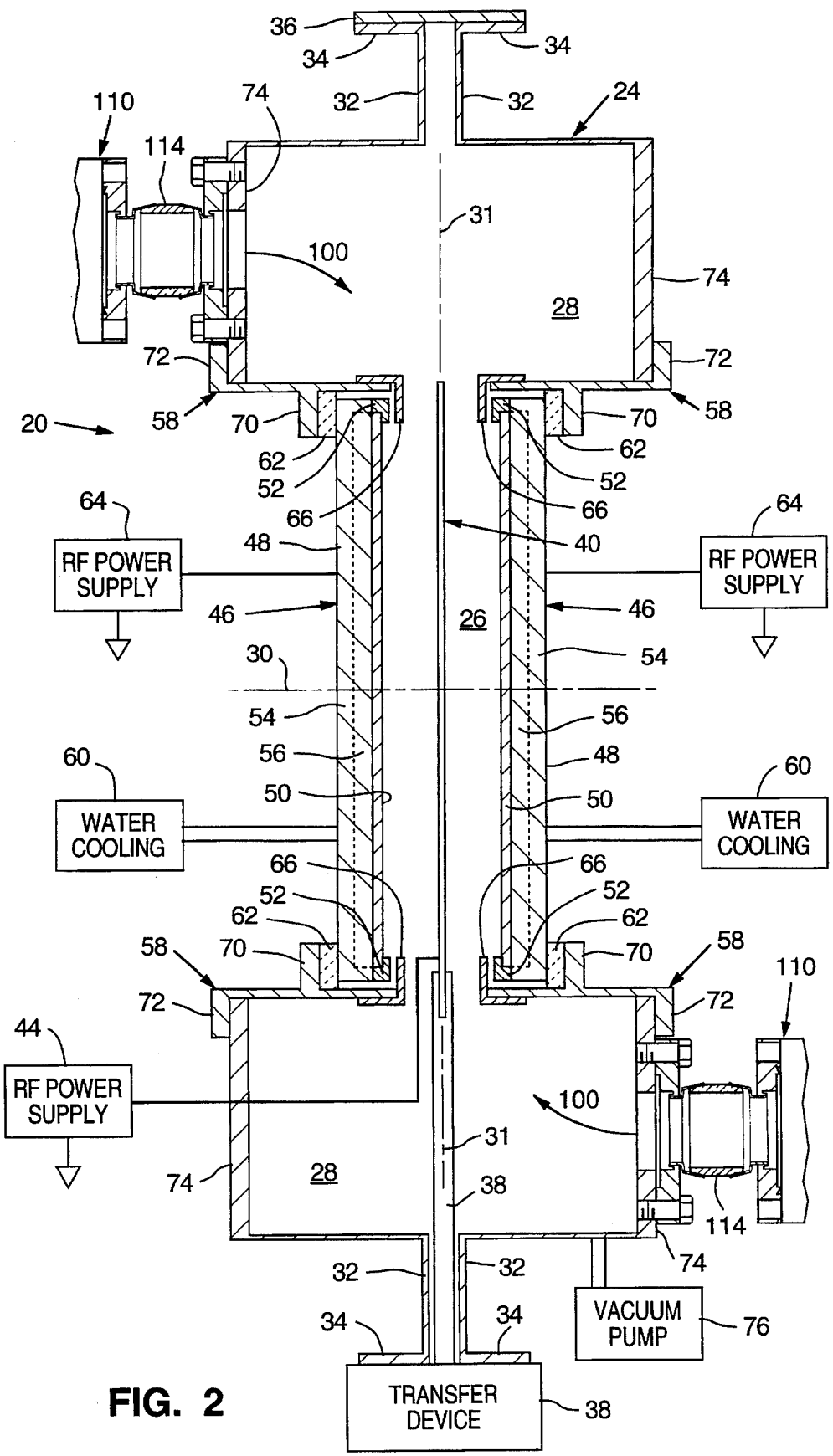
FIG. 2 is a vertical section of a sputtering apparatus according to the present invention, with the section taken along line 2—2 of FIG. 1.
Figure 3:
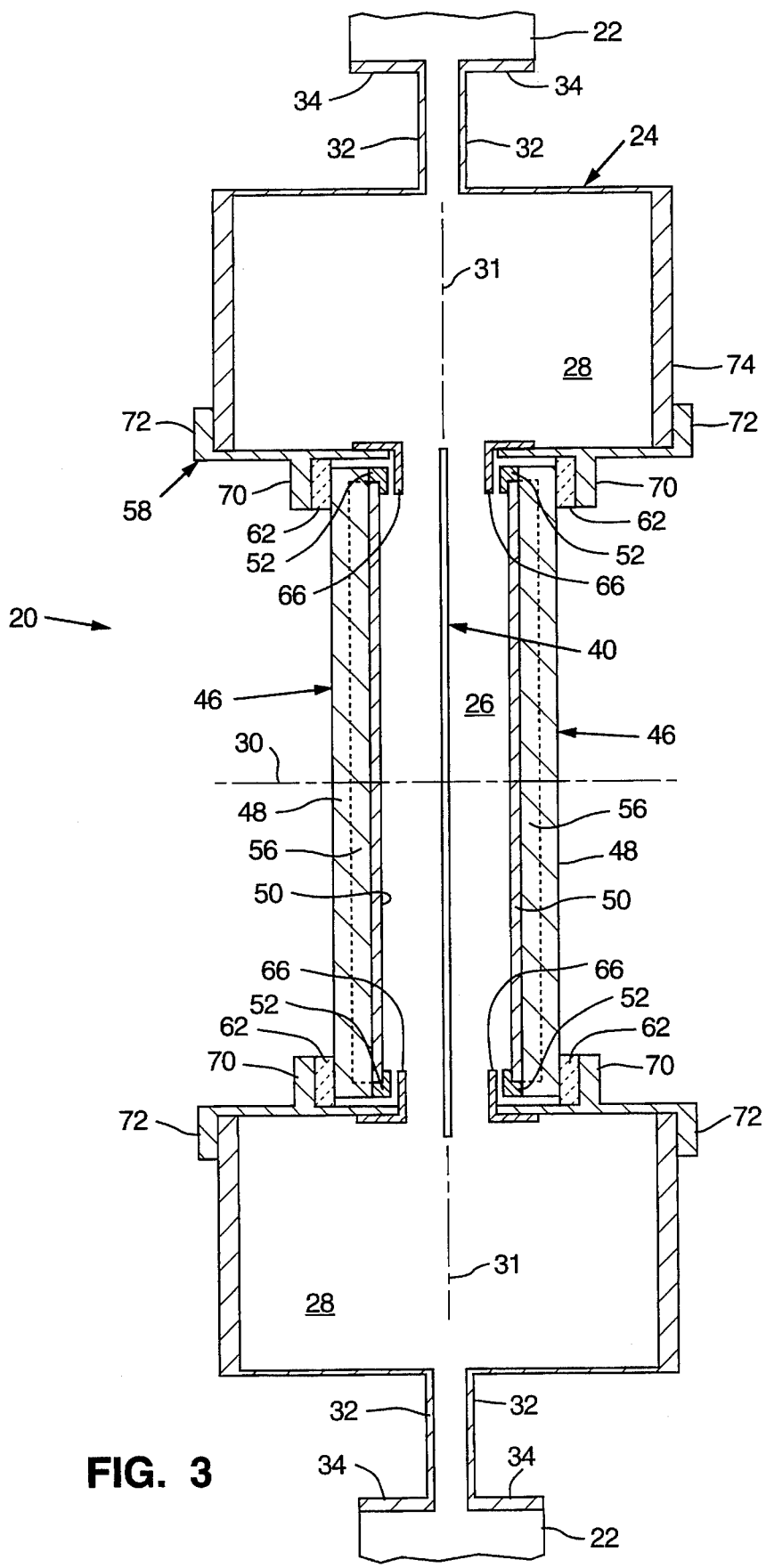
FIG. 3 is a horizontal section of a sputtering apparatus according to the present invention, with the section taken along line 2—2 of FIG. 1.

As shown in FIGS. 1–3, a circularly symmetric sputtering apparatus 20 according to the present invention is illustrated. Two or more sputtering apparatus 20 can be connected together via air locks 22 having rectangular isolation valves (FIG. 1) to form a multistation, in-line processing system with the ability to isolate the sputtering apparatus at each station. Each sputtering apparatus 20 includes a spool-shaped process chamber 24 having a central sputtering region 26 surrounded by an annular plasma distribution region 28, both of which are centered on and are circularly symmetrical about a process chamber axis 30. The process chambers are also symmetrical about a vertical center plane 31. The outer periphery of the process chamber 24 has two parallel side plates 32 that extend outward to flanges 34 that define an overall square or rectangular shape (in side view) of the sputtering apparatus 20. Portions of the gap between the side plates 32 are sealed by cover plates 36, while other portions of the gap are open either to the air locks 22 or to a transfer mechanism 38 located below the process chambers.

Positioned within the process chamber at the vertical center plane 31 is a pallet 40 containing several substrates 42 to be processed by the sputtering apparatus of the present invention. The pallet 40 engages the periphery of the substrates, allowing both sides of the substrates to be sputtered simultaneously. The pallet 40 is moved through the process chamber 24 by the transfer mechanism 38, although the pallet is stationary during a sputtering operation. A suitable transfer mechanism is described in U.S. Pat. No 4,042,128, invented by R. L. Shrader, entitled "Substrate Transfer Apparatus for a Vacuum Coating System," issued Aug. 16, 1977, and assigned to Airco, Inc., which is hereby incorporated by reference. The pallet 40 may be guided and supported by rollers (not shown) located above and below the central sputtering region 26, and may be moved horizontally by motor-driven pinion gears that engage a rack fixed to the bottom of the pallet 40, as described in U.S. Pat. No. 4,042,128. The substrate platen 40 is electrically and thermally isolated from its carriage transfer mechanism by ceramic standoffs (not shown). An rf power supply and impedance-matching network 44 (FIG. 2) is electrically connected to the pallet and substrates 42 contained thereon to permit biasing the substrates during sputtering.

The sputtering process is accomplished by two high-radiofrequency-powered planar disk diodes 46 in a gas discharge supplied by two coldwall hollow-cathode plasma devices 110 that are flange mounted to the process chamber 24 at the top and bottom, symmetrically spaced and 180° apart. The hollow-cathode plasma devices 110 supply ionized gas or gases 100 to the annular plasma distribution region 28, and from there the ionized gas or gases diffuse uniformly into the central sputtering region 26 adjacent the planar disk diodes 46 and the substrates 42. The hollow-cathode plasma devices 110 will be described in more detail below with reference to FIGS. 4–9.

As best shown in FIG. 2, the two planar disk diodes 46 form the lateral boundaries of the central sputtering region 26 of the process chamber 24. The planar disk diodes are centered on and are circularly symmetrical about the process chamber axis 30. Each planar disk diode 46 includes a disk-shaped electrode 48 and an attached sputtering target 50. The targets face the inside of the process chamber 24 adjacent the substrates 42 on the pallet 40. A target clamping ring 52 secures the sputtering target 50 to the inner face of the electrode 48 with a conductive elastomer membrane (not shown) therebetween. The planar-disk-diode electrode 48 consists of a stainless steel outer housing 54 and an inner copper insert 56 brazed (or electron-beam-welded) to the inner face of the electrode. The copper insert 56 has a diameter about the same as that of the target 50. The stainless steel outer housing 54 provides mechanical strength and bolt-thread integrity for fastening the target clamping ring 52 and for attaching the electrode to a flanged mounted ring 58. Copper is used as an insert 56 for its thermal and electrical conductivity. The electrode 48 also has water-cooling channels (not shown) in which water is circulated from a water supply 60 to cool the disk diode. A planar ring 62 composed of an insulative material is positioned between the electrode 48 from the flanged mounting ring 58 to electrically isolate the electrode from the grounded process chamber 24. A high-radiofrequency power supply 64, containing an rf generator and a suitable impedance-matching network, is electrically connected to the electrode 48. An annular-ring ground shield 66 is fastened to the inside of the flanged mounting ring 58 and projects radially inward to cover and shield the target clamping ring 52.

The flanged mounting ring 58 mounts the rf planar disk diodes 46 to the process chamber 24 such that access to the sputtering targets 50 for replacement is gained by removing the flanged mounting ring from the process chamber. An inner flange 70 of the flanged mounting ring 58 is fastened to the planar disk diode 46 and all outer flange 72 is fastened to planar-ring-shaped side plates 74 of the annular plasma distribution region 28 of the process chamber 24. The flanged mounting ring 58 projects inward toward the center plane 31 so that the distance between the two disk diodes 46 and the substrates 42 may be set as desired. Note: several of the figures herein do not show details such as fastener bolts and bolt holes, or O-rings and O-ring grooves for the vacuum-to-air seals, or water-cooling channels of the rf planar disk diodes 46.

A high-radiofrequency-powered planar disk diode sputtering source similar to that used in the present invention is disclosed in U.S. Pat. No. 3,369,991, invented by P. D. Davidse and L. I. Maissel, entitled "Apparatus for Cathode Sputtering Including a Shielded RF Electrode," issued Feb. 20, 1968, and assigned to IBM Corp., which is hereby incorporated by reference.

The rf planar disk diode 46 is preferably operated at a radiofrequency of 13.56 MHz, and the coldwall hollow-cathode plasma devices 110 at the same frequency. A convenient size for the rf planar disk diode 46 that would result in attractive product throughputs is one having a target diameter of 20 inches (508 mm). The process chamber 24 preferably has an outside diameter of 36.0 inches (914.4 mm), an outside width of 6.63 inches (168.4 mm), and a wall thickness of 0.20 inch (5.0 mm), and is fabricated of an austenitic stainless steel, which is nonmagnetic.

The resulting plasma sustained by the coldwall hollow-cathode plasma devices is homogeneous, isotropic, and uniform in electron/ion density within this central magnetic-field-free region. A plasma density as high as $3 \times 10^{11}$ electrons and ions/cm$^3$ can be obtained at a typical pressure of 0.1 Pa (0.75 mtorr) corresponding to $2.5 \times 10^{13}$ atoms and/or molecules/cm$^3$, so that the degree of ionization is about $10^{-2}$ (i.e., 1.0 percent). The pressure can be as high as 1.0 Pa (7.5 mtorr) and as low as $10^{-3}$ Pa ($7.5 \times 10^{-6}$ torr) with the plasma remaining homogeneous. Over this pressure range with the long mean free paths, the has discharge is a diffusion plasma thus accounting for its uniformity.

The electron temperature is low, being slightly above 2 eV in an argon gas discharge. Argon (or other desired working gas or gases) is introduced at gas inlet of each of the two coldwall hollow-cathode plasma devices. Of course, the system operates in a vacuum, effectuated by vacuum pump 76 (FIG. 2), or desirably, a combination of pumps, such as a turbomolecular or compound turbomolecular and molecular-drag pump backed by a two-stage oil-sealed rotary vane pump together with the addition of a Polycold® Freon®-refrigerator cryocoil for high-speed pumping of water vapor. Because of the effectiveness of the electron trapping in the lobes developed by the alternating magnetic polarity, the floating potential is somewhat above ground potential and the plasma potential is some 10 V above the floating potential. Since the sputtering threshold for most materials is above 20 V, this very-high-plasma-density gas discharge is generated without the necessity of having to sputter any surface. The decoupling of the plasma excitation (by the hollow-cathode plasma device 110) from plasma-surface interaction (sputtering by the planar disk diode 46) is ideal because it allows independent control of voltage and current density at both the diode electrodes 48 and substrate electrode, powered by power supplies 64 and 44, respectively.

Since the high-radiofrequency-powered planar disk diodes 46 are located within the central sputtering region 26 surrounded by a plasma supplied by the separately controllable coldwall hollow-cathode plasma devices 110, there are several advantages to this configuration, among which are the following:

A) The planar disk diode electrode 48 has a minimal stray capacitance to ground, which thereby minimizes reactance currents and provides efficient rf power coupling to the target 50. This is accomplished in that the rf planar disk diode assembly is mounted from the outside on a flanged opening on the circular flat surface 74 of the spool-shaped process chamber 24, which allows the power and water connections to be made on the atmospheric-air side. This arrangement also allows the impedance-matching network of the rf power supply 64 to be located adjacent to the electrode assembly, thereby minimizing the length and inductance of a connecting-copper-strap and hence minimizing the inductive voltage drop and the resulting power loss.

B) The most efficient sputtering target voltage range is that over which the sputtering yields increase linearly with increasing voltage, i.e., in the 300 to 800 V range. Because the plasma generation and sputtering operations are decoupled, the target voltage is selected by its power supply 64 and the current density independently by power supplies 190 and 196 (FIG. 5) of the coldwall hollow-cathode plasma devices 110. Since the symmetry of the placement of the coldwall hollow-cathode plasma devices 110 and the circular symmetry of the planar disk diodes 46 both result in a uniform plasma density across the target 50, sputtering occurs at high rates and uniformly over the entire target area.

C) Utilization of sputtering target material is optimized because the target 50 is eroded uniformly over its area.

D) The collection efficiency of sputtering target material is optimized because, with a target diameter of 20 inches (508 mm) and a target-to-substrate spacing of 2.0 inches (50.8 mm), 81.9% of the target material lands on a substrate surface parallel to and coaxial with the target 50. The area of uniformity in film thickness and film morphology at the substrate is a diameter of 18 inches (457 mm) coaxial with the target 50.

E) Sputtering targets 50 comprised of or containing magnetic (ferromagnetic or ferrimagnetic) materials are uniformly and efficiently sputter-eroded, unlike in magnetron diode sputtering sources where magnetic target materials act as a magnetic shunt for the magnetic field.

F) During sputter deposition, the substrate platen 40 holding any number of disk substrates can be high-radiofrequency (13.56 MHz) biased for control of the film morphology.

G) Simultaneous dual-side coating as described herein is accomplished with the combination of two sputtering sources opposite one another and coaxially arranged as shown in FIGS. 2 and 3.

H) The configuration of oppositely facing circularly symmetric sputtering sources contained within a rectangular box chamber allows an inline modular sequence of these chambers with rectangular isolation valves 22 between them. The substrate platens 40 are transported from chamber to chamber by a carriage transfer mechanism 38 based upon the rack-and-pinion-drive principle and located in each chamber well below the processing area.

Figure 4:
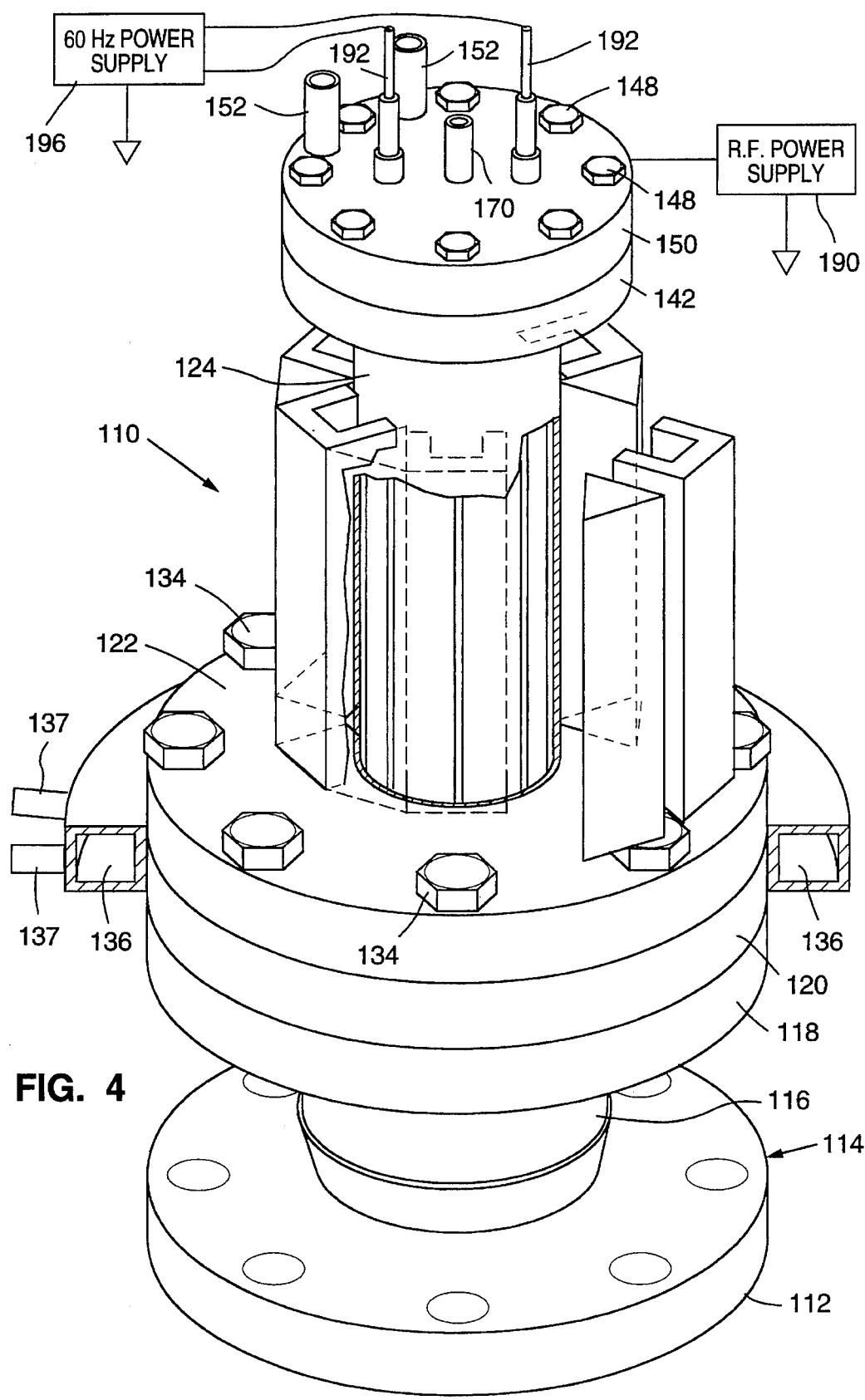
FIG. 4 is a perspective view, partially cut away, of a coldwall hollow-cathode plasma device with magnetic confinement, rf excitation, and with an option of thermionic electron emission used to supply plasma in the sputtering apparatus of the present invention.
Figure 5:
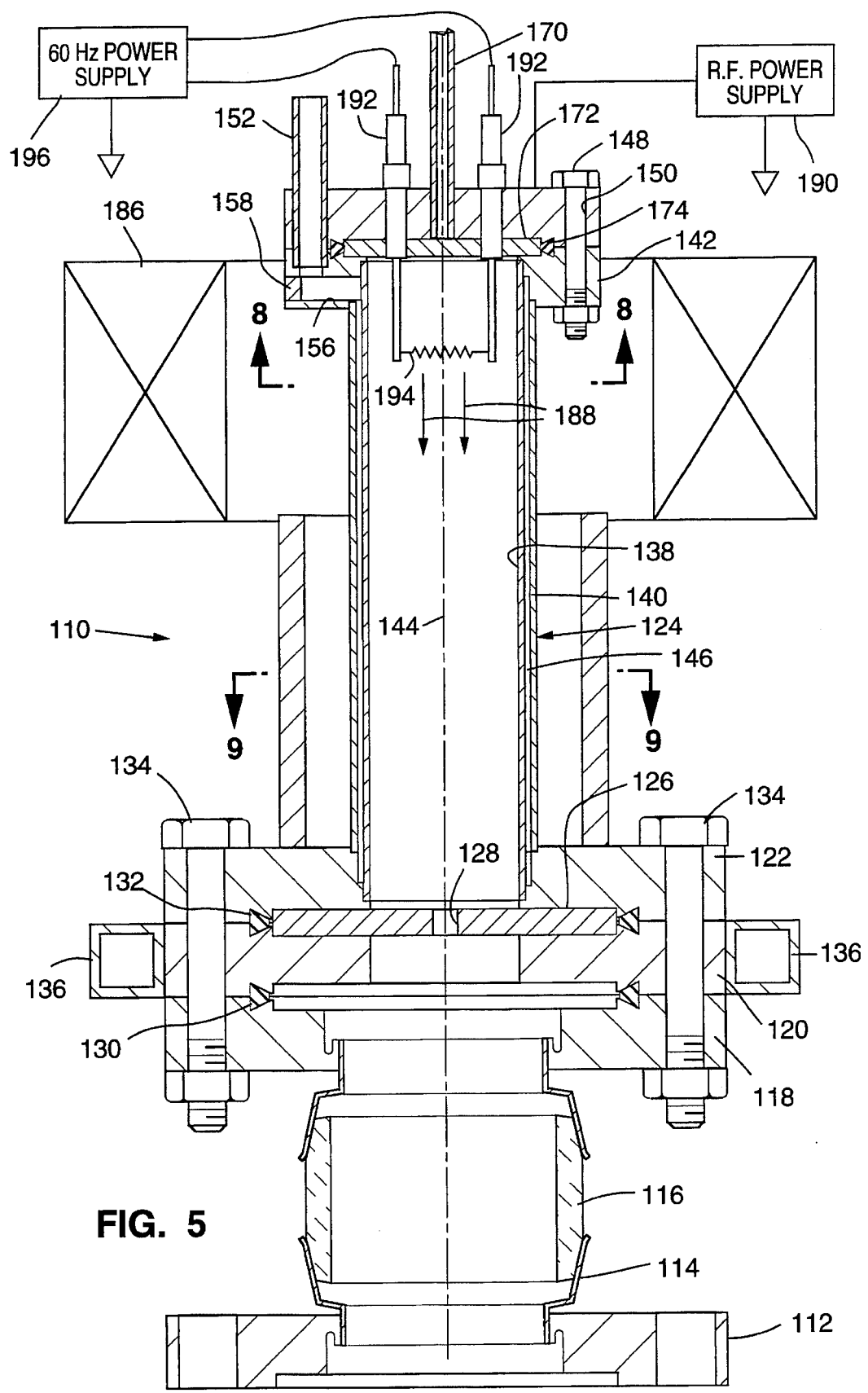
FIG. 5 is a side elevation sectional view through a longitudinal axis of the plasma device of the present invention.

Having described the process chamber, we turn now to the coldwall hollow-cathode plasma device 110 and FIGS. 4–9. The plasma device that supplies plasma to the process chamber 24 is preferably a coldwall hollow-cathode plasma device 110 with magnetic confinement, rf excitation, and with the option of thermionic electron emission. The plasma device 110, as shown in FIGS. 4 and 5, is mounted to the process chamber 24 in which glow-discharge sputter deposition and etching, reactive sputter deposition and etching, reactive plasma deposition, or other processes take place whereby a plasma generated by the plasma device 110 and supplied to the process chamber 24 is utilized.

The plasma device 110 is mounted to the process chamber 24 by a lower flange 112 of an electrical isolator 114. The electrical isolator 114 includes an electrical insulator 116 that electrically isolates the plasma device 110 from the process chamber 24. An upper flange 118 of the electrical isolator 114 mounts to a water-cooled, double-sided flange 120, which in turn mounts to a lower flange 122 of a cylindrical chamber 124. Positioned between flanges 120 and 122 is an aperture plate 126 (FIG. 5) composed of molybdenum or other high-temperature metal and having an aperture 128 through the center thereof. Seals 130 and 132 (FIG. 5) are installed between flanges 118, 120, and 122 and the flanges are bolted together with bolts 134. A tubular jacket 136 surrounds flange 120 and is connected to a source of water for cooling the flange and aperture plate 126. Water connections 137 supply water to the tubular jacket 136.

A plasma generated within the cylindrical chamber 124 flows through the aperture plate 126 and interior of the isolator 114 and into the process chamber 24. The cylindrical chamber 124 includes an inner tube 138 and an outer tube 140 both preferably composed of an austenitic (nonmagnetic) stainless steel with austenitic stainless steel flanges 122 and 142 welded to each end. The inner tube 138 and outer tube 140 are coaxial to a longitudinal axis 144 of the cylindrical chamber 124. There is a circumferential space 146 between the two tubes 138 and 140 in which flows a fluid that cools the chamber 124. This chamber cooling means will be described in further detail below.

The top flange 142 of the chamber 124 is bolted with bolts 148 to another flange 150 that serves as a connection point for cooling water, working gas, and radiofrequency electrical power. As to cooling the chamber 124, referring now to FIGS. 6, 7, and 8, two pipes 152 are welded to the upper flange 142 of the cylindrical chamber 124 and provide a fluid flow path into the circumferential space 146 between the two tubes 138 and 140 of the chamber. Flange 150 has two clearance holes 154 (FIG. 6) to allow the flange 150 to fit over the pipes 152. Within the top flange 142 of the chamber 124, there are two radial holes 156 (FIG. 6) drilled into the flange to the circumferential space 146. The radially outer portion of the radial holes 156 are sealed by plugs 158 (FIG. 6) welded to the flange 142. Thus, each of the pipes 152 is in fluid communication with the circumferential space 146. As shown in FIG. 7, which is an unfolded development view of the circumferential space 146, eight rods 160 and 162 divide the circumferential space into eight vertically extending cavities 164.

Figure 8:
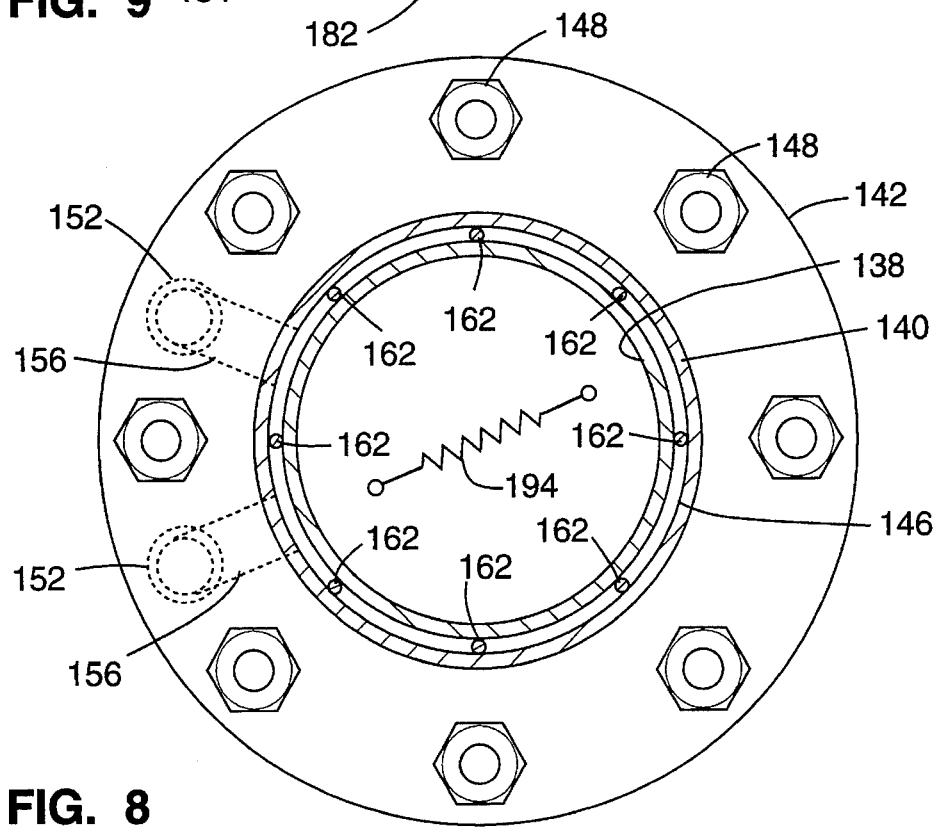
FIG. 8 is a sectional view of the plasma device of the present invention as taken along section line 8—8 of FIG. 5, and illustrates water-cooling connections in an upper flange of the device.

As best shown in FIG. 8, the rods 160 and 162 have a diameter substantially equal to the circumferential gap between the tubes 138 and 140. One rod 160, positioned between the two pipes 152, extends the entire vertical length of the circumferential space 146, whereas the other rods 162 extend just short of a flange, thereby providing a passageway between adjacent cavities 164. Water enters at one pipe 152, flows through the eight cavities 164 and cools the inner tube 138 by convection and conduction, and then exits at the other pipe 152.

Figure 6:
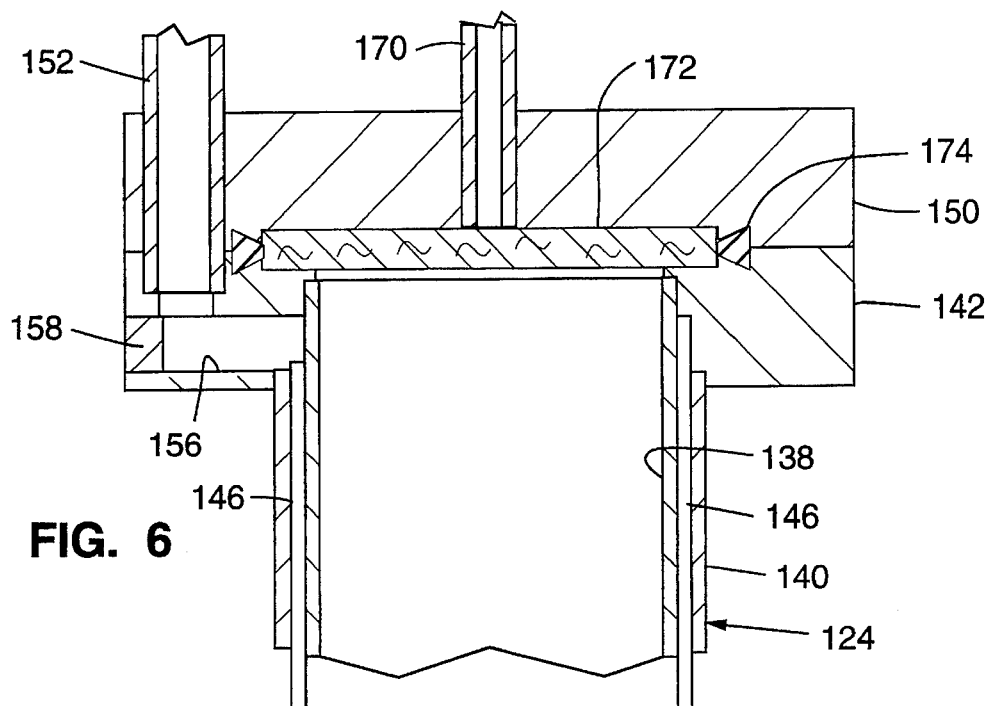
FIG. 6 is an enlarged detail side elevation sectional view of an upper flange of the plasma device of the present invention.
Figure 7:
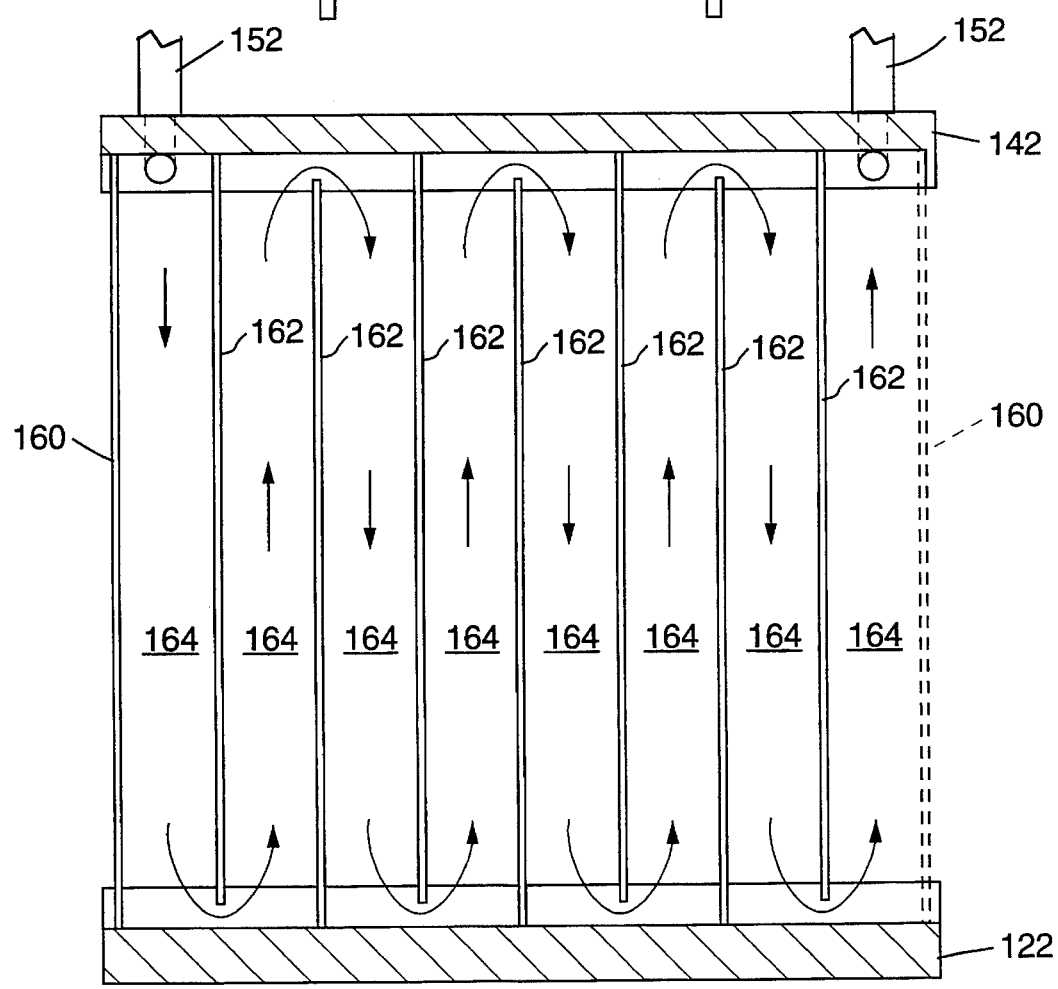
FIG. 7 is a development view of a cylindrical water-cooling jacket of the plasma device of the present invention.

A working gas, such as argon, is introduced into the top of the chamber 124 through a gas inlet tube 170, composed of an austenitic stainless steel, that is welded to flange 150, as shown in FIGS. 5 and 6. The gas inlet tube 170 extends through a hole in the flange 150 to a gas diffuser plate 172 that is confined between flanges 142 and 150. The gas diffuser plate 172 is preferably composed of a sintered porous metal sheet, made from an austenitic stainless steel powder or higher-nickel-content iron-nickel-chromium alloys. A seal 174 seals between the flanges 142 and 150 so that gas flowing through the tube 170 passes through the gas diffuser plate 172 to enter the chamber 124. The gas diffuser plate 172 distributes the gas from the gas inlet tube 170, and also prevents the plasma discharge from traveling up the gas inlet tube. Alternatively, a perforated metal disk can be used in place of the sintered porous metal for the gas diffuser plate 172. The pores or holes in the gas diffuser plate 172 must be smaller than the Debye length so that electrical shielding provided by the diffuser plate appears as a continuous surface to the plasma. The pores or holes in the gas diffuser plate 172 have a sufficiently small porosity so that the upstream pressure is substantially higher (e.g., several torr) than the pressure within the chamber 124 to prevent formation of a gas discharge in the gas inlet tube.

Figure 9:
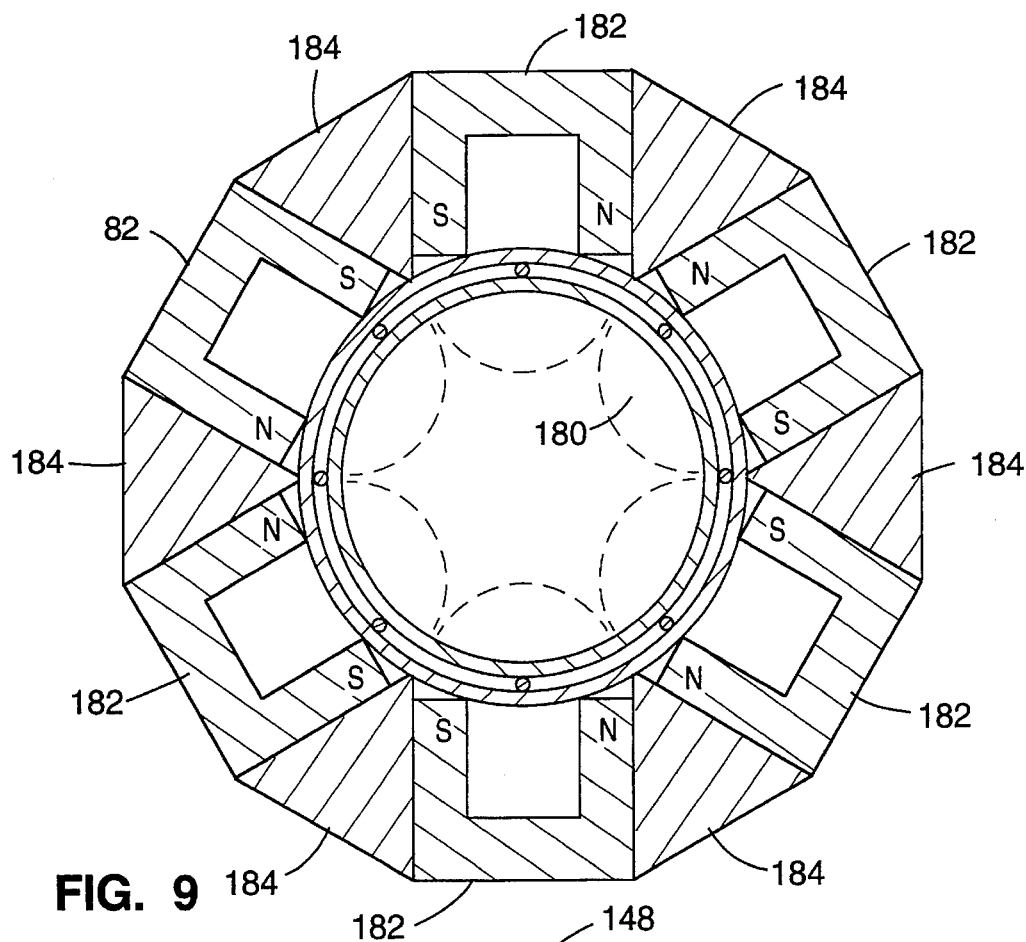
FIG. 9 is a sectional view of the plasma device of the present invention as taken along section line 9—9 of FIG. 5, and illustrates magnet placement and magnetic-field containment within the device.

Referring now to FIGS. 4, 5, and 9, the plasma generated within the cylindrical chamber 124 is confined by two magnetic fields that exist within the chamber. A multipolar magnetic field 180 (FIG. 9) is generated by six equispaced channel horseshoe permanent magnets 182 that surround the chamber 124. The channel horseshoe magnets 182 are arranged so that adjacent poles are of like polarity. The intervening spaces between adjacent magnets are filled by spacers 184, which are equilateral triangular rods made of high-permeability low-carbon steel or other ferromagnetic material. A commercially available convenient size for the channel horseshoe magnet, preferably made of Alnico 5 alloy, is a length of 3.250 inch (82.55 mm), width of 0.984 inch (25.00 mm), height of 0.797 inch (20.24 mm), gap width of 0.500 inch (12.70 mm), and gap depth of 0.524 inch (13.31 mm).

A second magnetic field is generated by a solenoidal magnet coil 186 that surrounds an upper portion of the chamber 124, as shown in FIG. 5. Solenoidal magnet coil 186 creates an axially oriented magnetic field 188 within the chamber 124. Magnetic field 188 along with magnetic field 180 generated by the horseshoe magnets confine the electrons and ions of the plasma to the lower portion of the chamber 124, from where the plasma exits through the aperture 128 and through the electrical isolator 114 and into the process chamber 24 below.

Optionally, as shown in FIG. 5, a thermionic element can be used to inject thermionic electrons into the hollow cathode. Flange 150 serves as the mounting point for two electrically insulated feedthroughs 192. Inside the chamber 124, a tungsten wire filament 194 is attached to the ends of the feedthroughs 192. Outside the chamber 124, the two feedthroughs 192 are electrically wired to a 60 Hz ac power supply 196. Current from the power supply heats the filament 194 to white-heat temperatures to emit thermionic electrons that assist in creating and maintaining the plasma within the chamber 124.

The cylindrical chamber 124, the water-cooling lines 137 and 152, and the gas inlet tube 170 are all electrically insulated from ground so that high-radiofrequency (13.56 MHz) power from a radiofrequency impedance-matching network and generator 190 can be applied to the plasma device 110. The main advantage of a high-radiofrequency diode discharge over a dc diode discharge is that secondary electron emission from the ion bombardment of a cold cathode is not needed to self-sustain the discharge because additional electrons are generated as a consequence of the fact that electrons oscillating in an rf field can acquire sufficient energy from the field to cause ionization in the body of the gas. The electron gains energy from the field if it undergoes collisions with gas atoms or molecules while it is oscillating so that its ordered simple harmonic motion is changed to a random motion. Such is the case provided the electron being accelerated by the rf electric field makes a collision with a gas atom or molecule before the field changes direction and decelerates the electron. Thus, the electron can increase the random component of its velocity with each elastic collision until it builds up sufficient energy to make an inelastic ionizing collision with a gas atom or molecule. The same principle applies to lower energy processes, such as gas atom or molecule excitation and gas molecule dissociation, which, too, are concurrent processes in gas discharges.

As a result of geometry of the forces imposed by the magnet configuration, the plasma is thereby confined in a magnetic bottle. The charged species (electrons and with them the ions) are reflected back into the plasma by the magnetic mirror, thereby extending their lifetime. The electrons whose lifetimes have been extended can gain energy from the high-radiofrequency field as explained above and cause further gas ionization. Another feature of the magnet configuration is the zero magnetic field which results at the very center axis of the tubular housing. Along this axis the electrons and along with them the ions have the easiest escape path out of the tube into the process chamber 24 as they are carried out by the gas flow in that direction.

Figure 10:
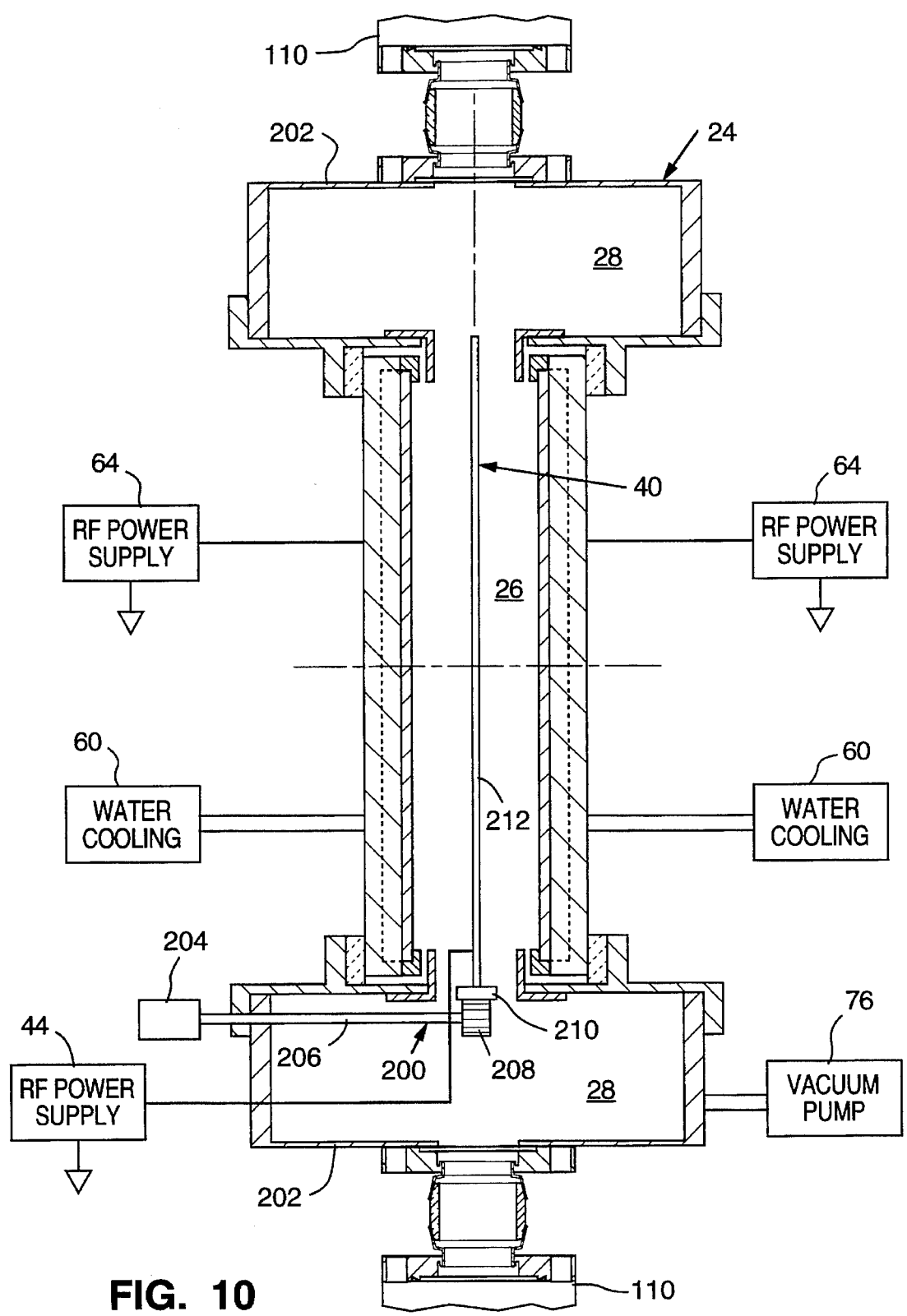
FIG. 10 is a vertical section of a sputtering apparatus according to the present invention illustrating an alternative placement of the coldwall hollow-cathode plasma devices.

An alternative placement of the coldwall hollow-cathode plasma devices 110 is illustrated in FIG. 10. By utilizing a transfer mechanism 200 that does not extend below the process chamber 24, the plasma devices 110 can be mounted on the top and bottom of the cylindrical outer surface 202 of the process chamber. The transfer mechanism 200 has a motor 204 that drives a shaft 206 having a pinion gear 208 on the end, which engages a rack 210 affixed to the lower surface of the substrate pallet 212. The pallet is also guided by means not shown. As with the embodiment shown in FIGS. 1—3, the FIG. 10 embodiment has an annular plasma distribution region 28 that receives plasma generated by the symmetrically disposed coldwall hollow-cathode plasma devices 110 and uniformly distributes the plasma to the central sputtering region 26.

From the above description, it will be apparent that the invention disclosed herein provides a novel and advantageous apparatus for the sputter-deposition of magnetic-recording and magneto-optical media onto substrates. The foregoing discussion discloses and describes merely exemplary methods and embodiments of the present invention. As will be understood by those familiar with the art, the invention may be embodied in other specific forms without departing from the spirit or essential characteristics thereof. For example, more than two plasma devices may be utilized to supply the plasma to the annular plasma distribution region, although it is preferable, regardless of number, that the plasma devices be symmetrically positioned around the annular region. Also, the coldwall hollow-cathode plasma device need not have a thermionic filament 194 to assist its generation of a plasma.

Accordingly, the disclosure of the present invention is intended to be illustrative, but not limiting, of the scope of the invention, which is set forth in the following claims.

What is claimed is:

1. A sputtering apparatus for depositing electrically conductive or insulating thin films on substrates, said apparatus comprising:

a process chamber having therein a central sputtering region and an annular plasma distribution region surrounding and open to the central sputtering region, wherein both the central sputtering region and the annular plasma distribution region are substantially free from externally-applied magnetic fields;

two planar disk diodes positioned in the central sputtering region of the process chamber and each having a sputtering target facing the central sputtering region, wherein the sputtering targets may be composed of either conductive or insulating material;

positioning means for positioning a substrate within the central sputtering region adjacent to the planar disk diode; and plasma generation means for supplying plasma to the annular plasma distribution region of the process chamber from two symmetrically-positioned plasma sources for diffusion into the central sputtering region of the process chamber to create a substantially uniform plasma therein.

2. A sputtering apparatus as recited in claim 1 wherein the central sputtering region and the annular plasma distribution region are centered about a process chamber axis.

3. A sputtering apparatus as recited in claim 2 wherein the plasma distribution region of the process chamber extends along the process chamber axis to a greater extent than does the sputtering region.

4. A sputtering apparatus as recited in claim 2 wherein the planar disk diodes are circularly symmetric with respect to the process chamber axis.

5. A sputtering apparatus as recited in claim 1 wherein the two planar disk diodes define opposite lateral boundaries of the process chamber in the sputtering region.

6. A sputtering apparatus as recited in claim 1 wherein the planar disk diodes are mounted to the process chamber by a mounting ring having means for attaching the mounting ring to the outside of the process chamber.

7. A sputtering apparatus as recited in claim 1 further comprising transfer means for moving the positioning means into and out of the sputtering region of the process chamber and for stopping the positioning means during a sputtering operation.

8. A sputtering apparatus as recited in claim 1 further comprising means for applying radiofrequency power to the planar disk diodes.

9. A sputtering apparatus as recited in claim 8 wherein the means for applying radiofrequency power to the planar disk diodes includes two power supplies each comprised of an impedance-matching network and a radiofrequency generator having one terminal connected to a planar disk diode and the other terminal connected to ground, and further includes insulation means for electrically isolating the planar disk diodes from the process chamber.

10. A sputtering apparatus as recited in claim 1 wherein said plasma generation means includes two or more coldwall hollow-cathode plasma devices symmetrically disposed about and attached to the annular plasma distribution region of the process chamber, and wherein each coldwall hollow-cathode plasma device supplies a plasma of ionized gas through an outlet thereof to the annular plasma distribution region of the process chamber.

11. A sputtering apparatus as recited in claim 10 wherein each coldwall hollow-cathode plasma device is electrically insulated from the process chamber and is driven by a separate radiofrequency power supply.

12. A sputtering apparatus as recited in claim 10 wherein each of the coldwall hollow-cathode plasma devices comprises:

a hollow-cathode chamber including an outlet therefrom, wherein the hollow-cathode chamber is composed of an electrically conductive material and has one or more walls;

means for introducing gas into the hollow-cathode chamber;

a multipolar magnet array surrounding at least a portion of the hollow-cathode chamber for confining a plasma to a region isolated from the walls of the hollow-cathode chamber; and means for applying radiofrequency power to the hollow-cathode chamber.

13. A sputtering apparatus as recited in claim 10 wherein the hollow-cathode chamber is cylindrical in shape and has a longitudinal axis and wherein the magnet array is coaxial to the longitudinal axis of the hollow-cathode chamber and surrounds the circumference of the hollow-cathode chamber along at least a portion of the longitudinal axis of the hollow-cathode chamber.

14. A sputtering apparatus as recited in claim 10 further comprising an aperture plate having an aperture therein providing the outlet from the hollow-cathode chamber.

15. A sputtering apparatus as recited in claim 10 wherein the hollow-cathode chamber is cylindrical in shape, and wherein the plasma device further comprises a solenoidal magnet coil positioned coaxially to a longitudinal axis of the hollow-cathode chamber and generating a magnetic field within the hollow-cathode chamber for confining the plasma within the hollow-cathode chamber to a region proximate the outlet from the hollow-cathode chamber.

16. A sputtering apparatus as recited in claim 11 further comprising a thermionic conductor within the hollow-cathode chamber and means for supplying current to the thermionic conductor.

17. A sputtering apparatus as recited in claim 1 further comprising means for connecting the process chamber to a process chamber of an adjacent sputtering apparatus of similar construction to allow substrates to be transferred between adjacent process chambers.

18. A sputtering apparatus for depositing thin films on substrates, said apparatus comprising:

a process chamber having therein a central sputtering region and an annular plasma distribution region surrounding and open to the central sputtering region, wherein the central sputtering region is cylindrical in shape with two planar disk diodes forming opposite lateral sides thereof and a circumferential periphery thereof being open to and surrounded by the annular plasma distribution region, and wherein the central sputtering region and the annular plasma distribution region are coaxial to a process chamber axis;

two planar disk diodes positioned in facing relationship in the sputtering region of the process chamber and coaxial to the process chamber axis, each planar disk diode having a sputtering target facing the central sputtering region in a plane normal to the process chamber axis;

means for applying radiofrequency power to the planar disk diodes;

positioning means for positioning a substrate within the central sputtering region between the two planar disk diodes in a plane normal to the process chamber axis;

plasma generation means for generating and supplying plasma to the annular plasma distribution region of the process chamber for diffusion into the central sputtering region of the process chamber to create a substantially uniform plasma therein, said plasma generation means including two or more coldwall hollow-cathode plasma devices symmetrically disposed about and attached to the annular plasma distribution region of the process chamber, and wherein each coldwall hollow-cathode plasma device supplies a plasma of ionized gas through an outlet thereof to the annular plasma distribution region of the process chamber.

19. A method for depositing electrically conductive or insulating thin films on a substrate, said method comprising the steps of:

providing a sputtering apparatus having a process chamber with a central sputtering region and an annular plasma distribution region surrounding and open to the central sputtering region, wherein both the central sputtering region and the annular plasma distribution region are substantially free from externally-applied magnetic fields;

providing within the central sputtering region two planar disk diodes each having a target of material to be sputtered, wherein the sputtering target may be composed of either conductive or insulating material, and wherein the diodes define lateral boundaries of the central sputtering region of the process chamber;

locating a substrate to be sputtered adjacent to and between the planar disk diodes in the central sputtering region;

generating a plasma by two plasma-generating means located symmetrically outside the process chamber and supplying the plasma to the annular plasma distribution region of the process chamber for diffusion into the central sputtering region to create a substantially uniform plasma therein; and then providing radiofrequency power to the targets of the planar disk diodes to cause atoms to dislodge from the targets and form a thin film on the substrate.

20. A method as recited in claim 19 wherein the step of generating a plasma is performed by two or more coldwall hollow-cathode plasma devices symmetrically disposed about and attached to the annular plasma distribution region of the process chamber, and wherein each coldwall hollow-cathode plasma device supplies a plasma of ionized gas through an outlet thereof to the annular plasma distribution region of the process chamber.

21. A sputtering apparatus for depositing thin films on substrates, said apparatus comprising:

a process chamber having therein a central sputtering region and an annular plasma distribution region surrounding and open to the central sputtering region, wherein both the central sputtering region and the annular plasma distribution region are substantially free from externally-applied magnetic fields;

two planar disk diodes positioned in the central sputtering region of the process chamber and each having a sputtering target facing the central sputtering region;

positioning means for positioning a substrate within the central sputtering region adjacent to the planar disk diode; and plasma generation means for generating and supplying plasma to the annular plasma distribution region of the process chamber for diffusion into the central sputtering region of the process chamber, said plasma generation means including two or more coldwall hollow-cathode plasma devices symmetrically disposed about and attached to the annular plasma distribution region of the process chamber, and wherein each coldwall hollow-cathode plasma device supplies a plasma of ionized gas through an outlet thereof to create a substantially uniform plasma within the annular plasma distribution region of the process chamber.

\* \* \* \* \*